(12) United States Patent
Chakravorty et al.

(10) Patent No.: US 6,512,861 B2
(45) Date of Patent: Jan. 28, 2003

(54) PACKAGING AND ASSEMBLY METHOD FOR OPTICAL COUPLING

(75) Inventors: Kishore K. Chakravorty, San Jose, CA (US); Ian A. Young, Portland, OR (US); Joseph F. Ahadian, Beaverton, OR (US); Johanna Marie Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/892,921

(22) Filed: Jun. 26, 2001

(65) Prior Publication Data

US 2002/0196997 A1 Dec. 26, 2002

(51) Int. Cl.⁷ .................................................. G02B 6/12
(52) U.S. Cl. .......................................................... 385/14
(58) Field of Search .............................. 385/14, 32, 33, 385/35, 36

(56) References Cited

U.S. PATENT DOCUMENTS

| | | | | |
|---|---|---|---|---|
| 5,394,490 A | * | 2/1995 | Kato et al. | 257/432 |
| 5,521,992 A | * | 5/1996 | Chun et al. | 257/666 |
| 5,600,741 A | * | 2/1997 | Hauer et al. | 385/14 |
| 5,696,862 A | * | 12/1997 | Hauer et al. | 385/14 |
| 5,761,350 A | * | 6/1998 | Koh | 385/14 |
| 6,389,202 B1 | * | 5/2002 | Delpiano et al. | 385/14 |

* cited by examiner

Primary Examiner—Tulsidas Patel
(74) Attorney, Agent, or Firm—Blakely, Sokoloff, Taylor & Zafman LLP

(57) ABSTRACT

A package allowing both electrical and optical coupling between one or more integrated circuits and a printed circuit board (PCB) has optical waveguide structures in addition to electrical connections. An optically active device may be flip-bonded directly to an integrated circuit using solder bump technology. The integrated circuit then flip-bonded or wire-bonded to a BGA package. The package has alignment rails or balls and V-grooves to anchor the alignment rails/balls to align the BGA package to the PCB. The BGA package is bonded to the PCB using solder reflow technology.

43 Claims, 15 Drawing Sheets

PACKAGING AND ASSEMBLY METHOD FOR OPTICAL COUPLING

RELATED APPLICATIONS

The present application is related to:

U.S. patent application Ser. No. 09/741,563, filed Dec. 19, 2000, titled "Photonic and Electronic Components on a Shared Substrate with Through-Silicon Communication,";

U.S. patent application Ser. No. 09/741,520, filed Dec. 19, 2000, titled "Method of Creating a Photonic Via Using Fiber Optic,";

U.S. patent application Ser. No. 09/741,532, filed Dec. 19, 2000, titled "Method of Creating a Photonic Via Using Oxide Deposition,"; and

BACKGROUND OF THE INVENTION

1. Field of the Invention

The invention is related to packaging and in particular to electronic, electrical, and optical packaging.

2. Background Information

There are several levels of packaging that designers of high-speed optical communication systems must consider. One is at the chip (or integrated circuit), device, or component level, where the individual components have to be connected to printed circuit boards, for example. Discrete components have tiny wires or leads that have to be connected to printed circuit board solder pads that are usually much larger than the component's leads. Designers must consider that the pitch of the component wires is different than the pitch of the solder pads. Designers also must consider that the length of the wires, or the distance between the component and the printed circuit board, can affect operation of the circuitry.

A third level of packaging that designers must consider is at the printed circuit board (or PCB) level. Printed circuit boards typically use epoxy glass (or FR-4) organic material as a dielectric, which limit high-speed communication capabilities because the epoxy glass absorbs some of the electrical signal, causing the electrical signal to be degraded by loss and dispersion. There may also be "impedance discontinuities" among regions on the PCB, which produce "reflections" that cause noise, ringing, etc., at high frequencies. The noise can intermingle with the signal being transmitted such that the signal becomes distorted, especially when using low signal voltages whose noise tolerance is low. All these effects create a limitation in the maximum frequency that can be propagated electrically.

Optical signal propagation has advantages for signal propagation in that it does not have the same reflection issues, electromagnetic interference (EMI) issues, or crosstalk issues as electrical signal propagation does. Optical signal propagation also tolerates a much larger bandwidth than electrical signal propagation.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
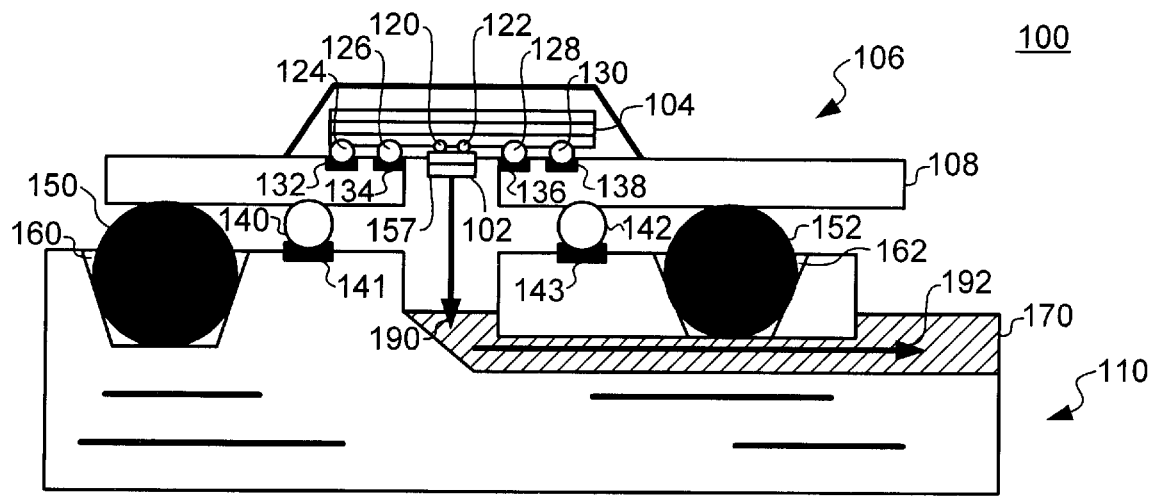
FIG. 1 is a cross-sectional view of a package suitable for implementing embodiments of the present invention, in which a bottom emitting or sensing optically active device is flip-bonded on a driver or transimpedance amplifier chip, the driver or transimpedance amplifier chip is flip-bonded on a ball grid array (BGA) package substrate, and the BGA package is solder reflowed to a printed circuit board (PCB)

A package and method to assemble the package to optically and electrically couple high-speed communications from chip to chip and from board to board are described in detail herein. In the following description, numerous specific details, such as particular processes, materials, devices, and so forth, are presented to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring embodiments of various embodiments of the invention.

Some parts of the description will be presented using terms such as substrate, Ball Grid Array (BGA) package, printed circuit board (PCB), flip-bonded, wire-bonded, solder bump technology, and so forth. These terms are commonly employed by those skilled in the art to convey the substance of their work to others skilled in the art.

Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete blocks performed in turn in a manner that is most helpful in understanding the invention. However, the order in which they are described should not be construed to imply that these operations are necessarily order dependent or that the operations be performed in the order in which the blocks are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Presently, on a microprocessor printed circuit board (PCB) an optical modulator chip, such as a light emitter or a light modulator, receives an electrical signal from a microprocessor chip and modulates the electrical signal into an optical signal. The electrical signal carries the information to be communicated from the microprocessor chip to a memory chip or another logic chip, and therefore the optical signal also carries this information. A light sensor (or photodetector) detects the optical signal, converts the optical signal back to an electrical signal, and sends the electrical signal to a transimpedance amplifier chip, which increases the strength of the electrical signal and sends the electrical signal to the memory chip or other logic chip.

When the speed of communication chip to chip is increased beyond around two Gigabits per second, proper operation may be affected unless careful attention is paid to packaging of the microprocessor chip, the optical modulator chip, the receiving electrical chip, and the detector. For example, the packaging of the optical driver chips, receiver chips, transimpedance amplifier chips, discrete devices, and other discrete components must enable and optimize performance of the particular components. The optical signals the device transmits must be coupled with minimal distortion, degradation, interference, etc., for the data to be accurately and reliably communicated. The electrical signals coupled to and from the discrete devices via the driver chips and transimpedance amplifier chips also must have minimal distortion, degradation, interference, etc. This is not always achievable because the manner in which components are packaged can limit performance of the components.

When components are spaced too far apart from each other parasitic capacitance, resistance, and inductance may affect electrical signals traveling between the components. Moreover, the microprocessor chip and memory chip are typically very-large-scale integration (VLSI) chips, which contain more than a thousand transistors, while the driver chip and transimpedance amplifier chip are medium-scale integration (MSI) chips, which contain between ten and a thousand transistors.

One embodiment of the present invention bonds optically active devices to their associated driver chip or transimpedance amplifier chip, and bonds the driver/transimpedance amplifier chip to a substrate (e.g., a ball grid array (BGA) package, a ceramic BGA package, a plastic BGA package, a multi-chip module (MCM) package, a pin grid array (PGA) package, an organic land grid array (OLGA) package, and the like.) to produce a single package with low parasitic capacitance and short interconnect lengths. Optically active devices are any well known or future devices that generate light when stimulated, that sense light, convert light to electrical signals, or that condition light. Optically active devices include light emitters (e.g., lasers, light emitting or sensing diodes, and the like), light sensors (e.g., photodetectors), and optical modulators. The BGA package is bonded to a printed circuit board (PCB). The BGA substrate has a cavity to seat an optically active device and an optical via to couple the light emitted from the optically active device to the PCB.

Another embodiment of the present invention bonds optically active devices and their associated driver chip or transimpedance amplifier chip to the substrate of a Ball Grid Array (BGA) package to produce a single package with low parasitic capacitance and short interconnect lengths. The BGA package is bonded to a printed circuit board (PCB). The PCB has a waveguide structure to direct light to a receiving optically active detector device.

A third embodiment of the present invention flip-bonds optically active devices to their associated driver chip or transimpedance amplifier chip, flip-bonds or wire-bonds the driver/transimpedance amplifier chip to the substrate of a ball grid array (BGA) package, aligns the BGA package to a PCB by mechanically positioning BGA alignment balls or alignment rails in PCB alignment grooves, and fine tunes the alignment of the BGA package to a PCB using solder reflow technology. Alternatively, the BGA package is aligned with the PCB using BGA alignment grooves and PCB alignment balls or rails. The alignments ensure optimal coupling of optically active device(s) to the waveguide structure and on to a receiving optically active device.

A fourth embodiment of the present invention provides a machine-readable medium with machine-readable instructions stored thereon to cause a machine to flip-bond optically active devices to their associated driver chip or transimpedance amplifier chip, flip-bond or wire-bond the driver/transimpedance amplifier chip to the substrate of a ball grid array (BGA) package, mechanically position BGA alignment balls or alignment rails in PCB alignment grooves, and solder reflow the BGA package to the PCB.

Alignment also may be accomplished using a dual optical alignment system. In this embodiment, there is one optical alignment system for the upper device (e.g., optically active device) and one optical alignment system for the lower device (e.g., the driver chip or transimpedance amplifier chip).

FIG. 1 is a cross-sectional view of a package 100 suitable for implementing embodiments of the present invention. The example package 100 provides pitch transformation from fine pitch to coarse pitch. The package 100 includes a bottom emitting or sensing optically active device 102 (or a bottom detecting optically active device) that is flip-bonded on a driver or transimpedance amplifier chip 104, the driver or transimpedance amplifier chip 104 is flip-bonded on a ball grid array (BGA) package 106 substrate 108, and the BGA package 106 is solder reflowed to a printed circuit board (PCB) 110.

The active face of optically active devices, such as the device 102, is on the side opposite of the electrical traces. Example bottom emitting or sensing optically active devices are shown in FIGS. 1, 3, and 11 through 14. Example top emitting or sensing optically active devices are shown in FIGS. 2, 4, 5, and 10.

The device 102 emits (or detects) light when activated. The device 102 is surface normal and may be a vertical-cavity surface-emitting or sensing laser (VCSEL), a light emitting diode (LED), a photodetector, an optical modulator, or similar optically active device.

In one embodiment, a clearance 157 is made in the BGA substrate 108 for the device 102 and the light emitted by the device 102. Light from (or to) the device 102 passes through the clearance 157.

Conventionally, an underfill layer is often used between a flip bonded integrated circuit and a BGA substrate. As is well known, such underfill layer improves the reliability of the solder joint between an integrated circuit and a BGA substrate. The underfill layer is usually a polymer material and, in this embodiment, fills the gap between the device 102 and the BGA substrate 108. In this embodiment, such underfill material may partially or fully fill the clearance in the BGA substrate 108. Accordingly, materials that are transparent to the emitted light should be selected for use as the underfill layer.

The driver or transimpedance amplifier chip 104 is any integrated circuit suitable for applying an electrical signal to the device 102 to activate the device 102. Implementation of the driver or transimpedance amplifier chip 104 is well known.

The BGA package 106 can be any well-known flip-chip Ball Grid Array package. The BGA substrate 108 in one embodiment is an organic laminate substrate that uses epoxy resin dielectric materials or bismaleimide triazine (BT) materials, and copper conductors or traces. In another embodiment, the BGA substrate 108 is a multi-layer ceramic substrate based on aluminum oxide ($Al_2O_3$).

The PCB 110 typically has an insulating layer made of epoxy glass. The PCB 110 also has an electric circuit with various conducting strips or traces that connect to each other based on the particular PCB application. The PCB 110 may be a multi-layer PCB with several insulating layers and conducting layers, with each conducting layer having its own traces. Printed circuit boards suitable for implementing the present invention are well known.

According to the embodiment shown in FIG. 1, the device 102 is flip-bonded on the driver or transimpedance amplifier chip 104 using well known solder bump technology. For example, the device 102 has two solder bumps 120 and 122, which are very tiny and spaced very close together. The device 102 may have more than two solder bumps. If the device 102 were to be mounted directly on the PCB 110, the PCB 110 would have to have very fine features to accommodate the tiny and closely spaced solder bumps 120 and 122. This may cause the PCB 110 to be more complex and the manufacturing process for the PCB 110 would be very costly. The package 100 accommodates existing PCB manufacturing by mounting the device 102 to the driver or transimpedance amplifier chip 104 using the tiny solder balls of the device 102, and mounting the driver or transimpedance amplifier chip 104 to the BGA substrate 108. In the embodiment shown in FIG. 1, the BGA package 106 is flip-bonded to the PCB 110 using solder balls 140 and 142, whose pitch may be 1.27 millimeters such that the pitch is compatible with conventional PCB technology and does not require high-density substrates.

The driver or transimpedance amplifier chip 104 includes bumps 124, 126, 128, and 130, which electrically connect the driver or transimpedance amplifier chip 104 to traces on the BGA substrate 108. The bumps 124, 126, 128, and 130 may be made of solder or other type of metal(s) that melt and create a bond (e.g., lead-tin compositions (PbSn), tin-silver (SnAg) compositions, nickel (Ni) compositions. In the embodiment in which the bumps 124, 126, 128, and 130 are made of solder, the solder melts during reflow and the surface tension of the molten solder centers the driver or transimpedance amplifier chip 104 correctly over pads 132, 134, 136, and 138, respectively, on the BGA substrate 108.

In some instances, it may be desirable to direct light from the device 102 on the PCB 110. In one embodiment, the PCB 110 has an optical waveguide 170 for this purpose. The waveguide 170 may be faceted 45 degrees and laminated on the PCB 110.

The BGA package 106 has alignment balls (or alignment rails) 150 and 152, and the PCB 110 has alignment grooves, such as V-grooves 160 and 162. The alignment rails 150 and 152 mate with the V-grooves 160 and 162 to anchor the BGA package 106 to the PCB 110. The alignment rails 150 and 152 and the V-grooves 160 and 162 provide gross mechanical alignment of the BGA package 106 to the PCB 110. Of course, the alignment balls/rails and alignment grooves are interchangeable, e.g., the alignment balls/rails and alignment grooves may be located on the PCB 110 and BGA package 106, respectively.

For fine alignment of the BGA package 106 to the PCB 110, the solder balls 140 and 142 are subject to high temperature, which causes the solder balls 140 and 142 to melt. When the solder balls 140 and 142 melt, the surface tension pulls the BGA package 106 into alignment with the PCB 110. Surface tension is the attraction that the molecules at the surface of a drop of melted solder have for each other. The attraction the solder molecules have for each other is greater than the attraction the solder molecules have for the BGA substrate 108 so that the solder does not spread.

When the BGA package 106 is placed over the PCB 110, the alignment rails 150 and 152 loosely sit inside the V-grooves 160 and 162 and provide a coarse alignment in the "x-y" direction. Each alignment ball has some room to move within its associated V-groove. On the other hand, the solder balls 140 and 142 of the BGA package 106 rest over pad areas 141 and 143, respectively, on the PCB 110. Thus, the solder ball-to-pad contact determines the vertical separation of the BGA package 106 and the PCB 110. This design feature ensures that solder balls and pad areas will remain in an intimate (i.e. high coupling efficiency) contact after assembly of the package 100.

In some instances, during reflow, the molten solder balls 140 and 142 may collapse resulting in some degree of flattening of the solder balls 140 and 142. This causes the relative separation between the BGA package 106 and the PCB 110 to decrease and therefore the alignment balls 150 and 152 move further down inside the V-grooves 160 and 162, respectively. Thus, ample clearance may be provided in the V-grooves 160 and 162 to retain z-axis movement freedom of the alignment balls 150 and 152 in the V-grooves 160 and 162.

The embodiment shown in FIG. 1 provides rough alignment of the BGA package 106 with the PCB 110. From the illustration it can be seen that the V-grooves 160 and 162 have a cone portion and a tapered slot portion such that the "x-y" dimension is set with the alignment balls 150 and 152 resting in the cone portion and the tapered slot portion. The dimensions of the alignment balls 150 and 152 and the V-grooves 160 and 162 are set to allow for additional "x-y" movement during solder reflow. For example, the dimension of the cone portion sets the initial "x-y" location. The tapered slot portion constrains "x" movement to reduce yaw. The cone portion and the tapered slot portion constrain the BGA package 106 in this nominal position during the package 100 manufacturing process.

The embodiment shown in FIG. 1 also provides fine alignment of the BGA package 106 with the PCB 110. The solder balls 140 and 142 rest on the pads 141 and 143, respectively, and self-align within the pads 141 and 143 during solder reflow. In this embodiment, the solder balls 140 and 142 set the height of the package 100 in the "z" dimension and have no constraint in the "x" dimension or the "y" dimension. The final tolerance may be determined by the placement accuracy of the flat pads 141 and 143.

The resulting gross alignment provided by the alignment balls 150 and 152 and the V-grooves 160 and 162 and the subsequent fine alignment provided by solder reflow techniques ensures the light emitted by the device 102 is properly aligned with the waveguide 170 on the PCB 110. After bonding, the aligned package 100 positions the device 102 correctly over the waveguide structure 170 facet.

The solder metallurgy for the joint(s) between the device 102 and the driver or transimpedance amplifier chip 104 has a higher melting temperature than the solder metallurgy for the joint(s) between the driver or transimpedance amplifier chip 104 and the BGA substrate 108. For example, well-known 63Pb/37Sn solder melts at 187 degrees Centigrade. This is done to ensure that joint(s) between the device 102 and the driver or transimpedance amplifier chip 104 maintains its integrity when the driver or transimpedance amplifier chip 106 is flip-bonded to the BGA substrate 108. In one embodiment, The solder bumps on the device 102 may be the same material as the solder bumps on the device 104 and the solder on the board has a lower melting point than the solder bumps.

The arrows 190 and 192 illustrate the direction light travels from the device 102, to the waveguide structure 170, and to a receiving optically active device (not shown).

Figure 2:
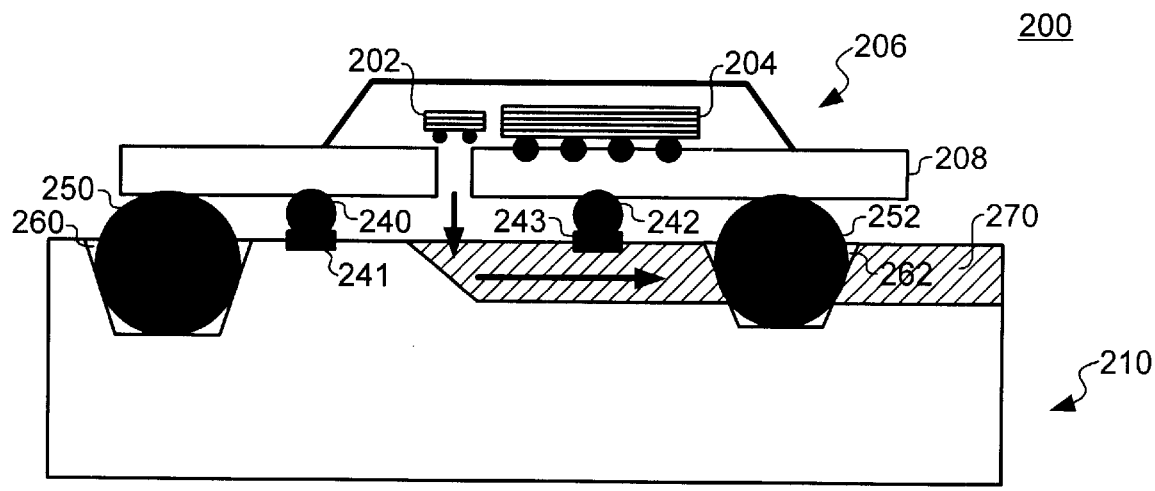
FIG. 2 is a cross-sectional view of an alternative package suitable for implementing embodiments of the present invention, in which a top emitting or sensing optically active device and a driver or transimpedance amplifier chip are flip-bonded on a BGA package substrate, and the BGA package is solder reflowed to a printed circuit board (PCB)

FIG. 2 is a cross-sectional view of an alternative package 200 suitable for implementing embodiments of the present invention, in which a top emitting or sensing optically active device 202 and a driver or transimpedance amplifier chip 204 are flip-bonded on a BGA package 206 substrate 208, and the BGA package 206 is bonded to a printed circuit board (PCB) 210 using solder reflow technology. The example package 200 also has an opening 220 and a waveguide structure 270 to direct the light from the device 202 through the PCB 210. The package 200 also includes the same or similar alignment balls, grooves, rails, etc., that the package 100 has. In an embodiment, the package 200 may be encapsulated on the on the upper side of the BGA package 206, for example, using over-molded plastic or a lid.

The example package 200 shows in more detail that when the BGA package 206 is placed over the PCB 210, the alignment rails 250 and 252 loosely sit inside the V-grooves 260 and 262 and each alignment ball has some room to move within its associated V-groove.

Figure 3:
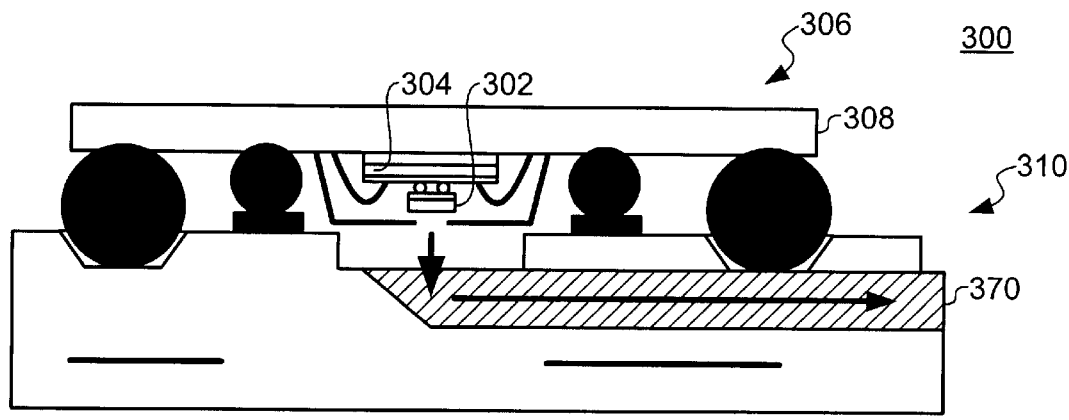
FIG. 3 is a cross-sectional view of an alternative package suitable for implementing embodiments of the present invention, in which a bottom emitting or sensing optically active device is flip-bonded on a driver or transimpedance amplifier chip and the driver or transimpedance amplifier chip is wire-bonded on a BGA package substrate, and the BGA package is solder reflowed to a printed circuit board (PCB)

FIG. 3 is a cross-sectional view of an alternative package 300 suitable for implementing embodiments of the present invention, in which a bottom emitting or sensing optically active device 302 is flip-bonded on a driver or transimpedance amplifier chip 304 and the driver or transimpedance amplifier chip 304 is wire-bonded on a BGA package 306 substrate 308, and the BGA package 306 is bonded to a printed circuit board (PCB) 310 using solder reflow technology. The example package 300 also has a waveguide 370 to direct the light from the device 302 through the PCB 310. The package 300 also includes the same or similar alignment balls, grooves, rails, etc., that the package 100 has.

Figure 4:
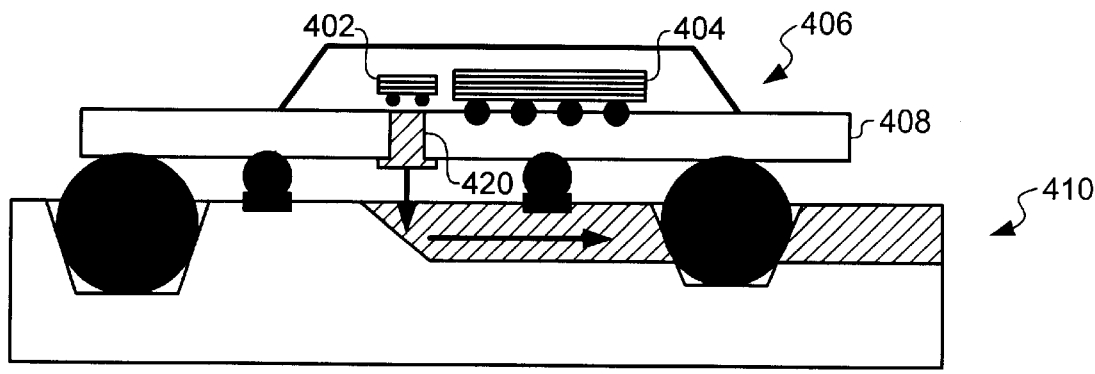
FIG. 4 is a cross-sectional view of an alternative package suitable for implementing embodiments of the present invention, in which an optical via in a substrate is filled with an underfill polymer.

FIG. 4 is a cross-sectional view of an alternative package 400 suitable for implementing embodiments of the present invention, in which a top emitting or sensing optically active device 402 and a driver or transimpedance amplifier chip 404 are flip-bonded on a BGA package 406 substrate 408, and the BGA package 406 is bonded to a printed circuit board (PCB) 410 using solder reflow technology, similar to the embodiment illustrated in FIG. 2. However, the example package 400 also has an optical via 420 drilled in the BGA substrate 408 and the optical via 420 is filled with an underfill polymer that has a higher index of refraction than the index of refraction of the BGA substrate 408 surrounding the optical via 420 (e.g., higher than FR4 epoxy, BT laminate, etc.). The filled optical via 420 may be used to direct light to/from the device 402.

When the device 402 is emitting or sensing light, the filled optical via 420 therefore behaves like a waveguide and collimates the otherwise divergent light beam. The optical via 420 is typically fabricated with good smoothness and the substrate 408 material does not significantly absorb the light emitted from the device 402.

Figure 5:
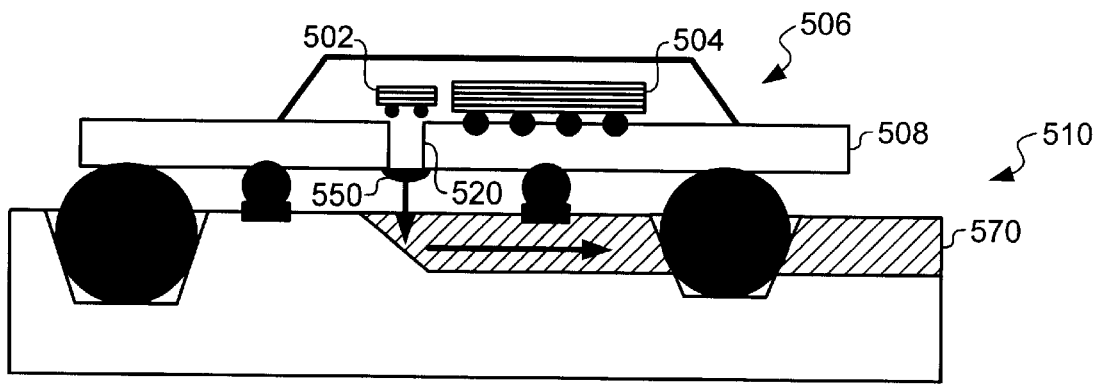
FIG. 5 is a cross-sectional view of an alternative package suitable for implementing embodiments of the present invention, in which an optical via in a substrate is terminated by a lens.

FIG. 5 is a cross-sectional view of an alternative package 500 suitable for implementing embodiments of the present invention, in which a top emitting or sensing optically active device 502 and a driver or transimpedance amplifier chip 504 are flip-bonded on a BGA package 506 substrate 508, and the BGA package 506 is bonded to a printed circuit board (PCB) 510 using solder reflow technology, similar to the embodiment illustrated in FIG. 2. The example package 500 has a waveguide 570 to direct the light from the device 502 through the PCB 510. The package 500 also has an optical via 520 drilled in the BGA substrate 508 to direct the device 502's light beam, similar to the embodiment shown in FIG. 4. However, the optical via 520 is terminated with a focusing element 550, such as a lens. When the device 502 is emitting or sensing light the focusing element 550 focuses the light beam emitted from the device 502 on the desired spot at the waveguide 570 facet. In one embodiment, the focusing element 550 is an optical polymer structure, which acts as a lens to focus the light to or from the device 502 to increase the coupling efficiency of the light (i.e., to avoid loss of signal power).

Figure 6:
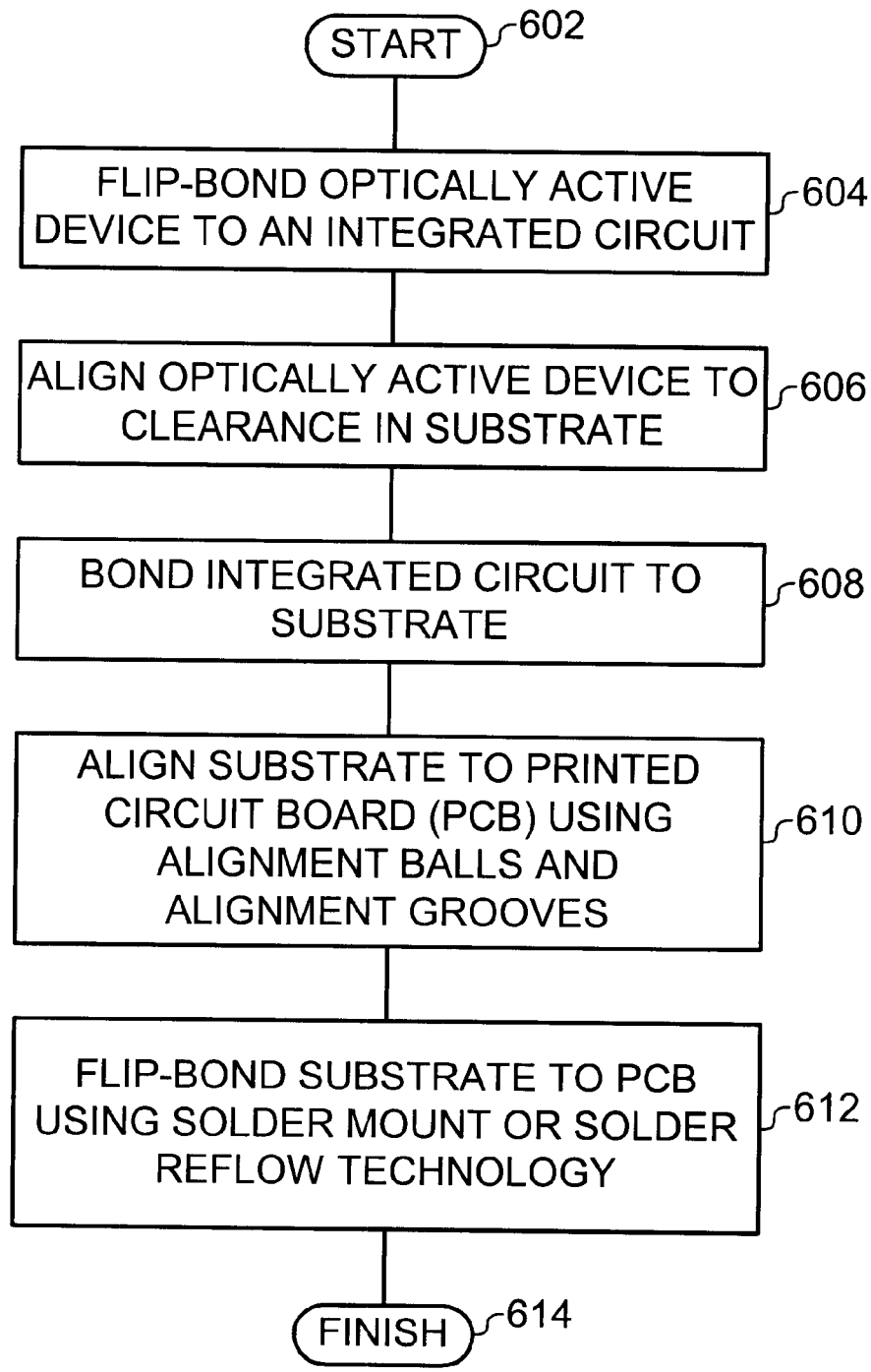
FIG. 6 is a flow chart depicting an example method to assemble the package depicted in FIG. 1.

FIG. 6 illustrates a flow chart depicting a process 600 to assemble the package 100. A machine-readable medium with machine-readable instructions stored thereon may be used to cause a machine to perform the process 600. The process 600 begins with block 602, where control immediately passes to block 604.

In block 604, an optical device is flip-bonded to an integrated circuit. In one embodiment, the device 102 is flip-bonded to the driver or transimpedance amplifier chip 104.

In block 606, the integrated circuit (e.g., the driver or transimpedance amplifier chip 104) is aligned to a clearance in a BGA package substrate using solder balls and solder reflow of solder balls on the BGA package substrate.

In block 608, the integrated circuit (e.g., the driver or transimpedance amplifier chip 104) is bonded to the BGA package. In one embodiment, the integrated circuit (e.g., the driver or transimpedance amplifier chip 104) is flip-bonded to the BGA package. In another embodiment, the integrated circuit (e.g., the driver or transimpedance amplifier chip 104) is wire-bonded to the BGA package.

In block 610, the BGA package is aligned to a PCB using BGA package alignment rails or balls and PCB alignment grooves.

In block 612, the BGA package is flip-bonded to the PCB using solder mount or solder reflow technology. The process 600 ends, as indicated by block 615.

Figure 7:
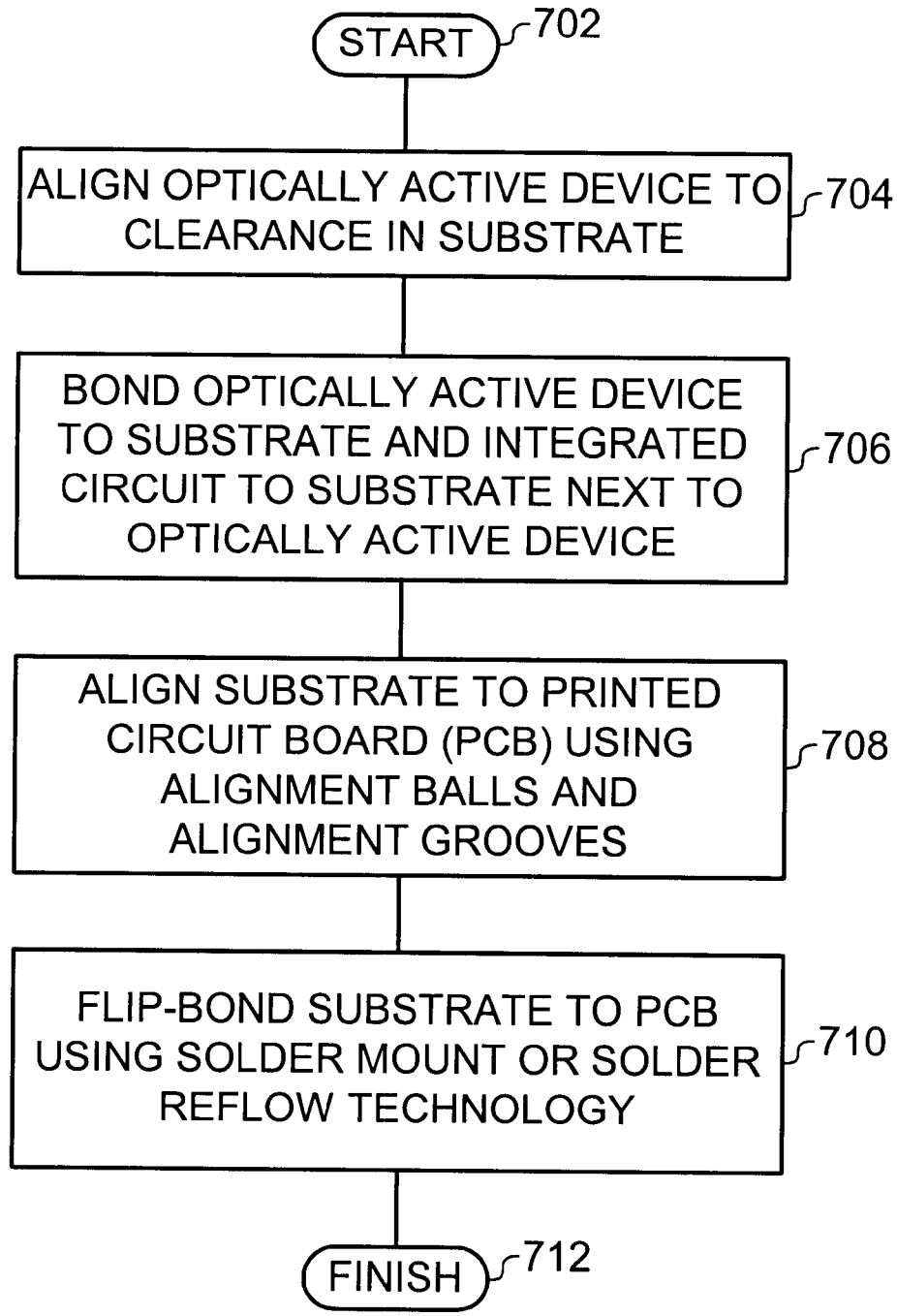
FIG. 7 is a flow chart depicting an example method to assemble the package depicted in FIG. 2.

FIG. 7 illustrates a flow chart depicting a process 700 to assemble the package 200. A machine-readable medium with machine-readable instructions stored thereon may be used to cause a machine to perform the process 700. The process 700 begins with block 702, where control immediately passes to block 704.

In block 704, an optical device (e.g., the device 502) is aligned to an opening in the BGA package substrate using solder balls and solder reflow of solder bumps on the BGA package substrate.

In block 706, the optical device (e.g., the device 502) and an integrated circuit (e.g., the driver or transimpedance amplifier chip 504) are bonded to a BGA package. In one embodiment, the optical device and the integrated circuit are flip-bonded to the BGA package. In another embodiment, the optical device and the integrated circuit are wire-bonded to the BGA package.

In block 708, the BGA package is aligned to a PCB using BGA package alignment rails or balls and PCB alignment grooves.

In block 710, the BGA package is flip-bonded to the PCB using solder mount or solder reflow technology. The process 700 ends, as indicated by block 712.

Figure 8:
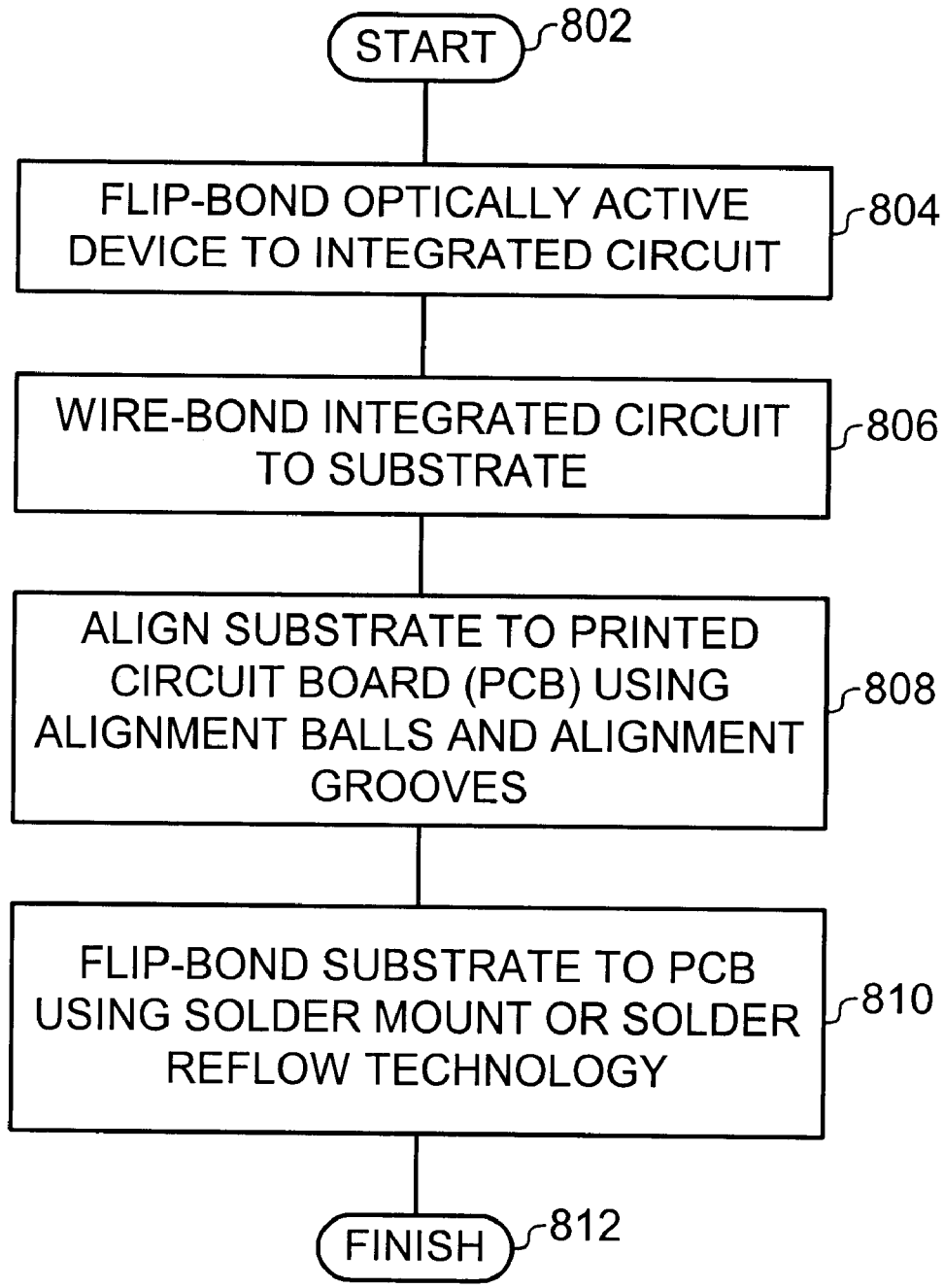
FIG. 8 is a flow chart depicting an example method to assemble the package depicted in FIG. 3.

FIG. 8 illustrates a flow chart depicting a process 800 to assemble the package 300. A machine-readable medium with machine-readable instructions stored thereon may be used to cause a machine to perform the process 800. The process 800 begins with block 802, where control immediately passes to block 804.

In block 804, an optical device is flip-bonded to an integrated circuit. In one embodiment, the device 302 is flip-bonded to the driver or transimpedance amplifier chip 304.

In block 806, the integrated circuit (e.g., the driver or transimpedance amplifier chip 304) is wire-bonded to a BGA package substrate.

In block 808, the BGA package is aligned to a PCB using BGA package alignment rails or balls and PCB alignment grooves.

In block 810, the BGA package is flip-bonded to the PCB using solder mount or solder reflow technology. The process 800 ends, as indicated by block 812.

Figure 9:
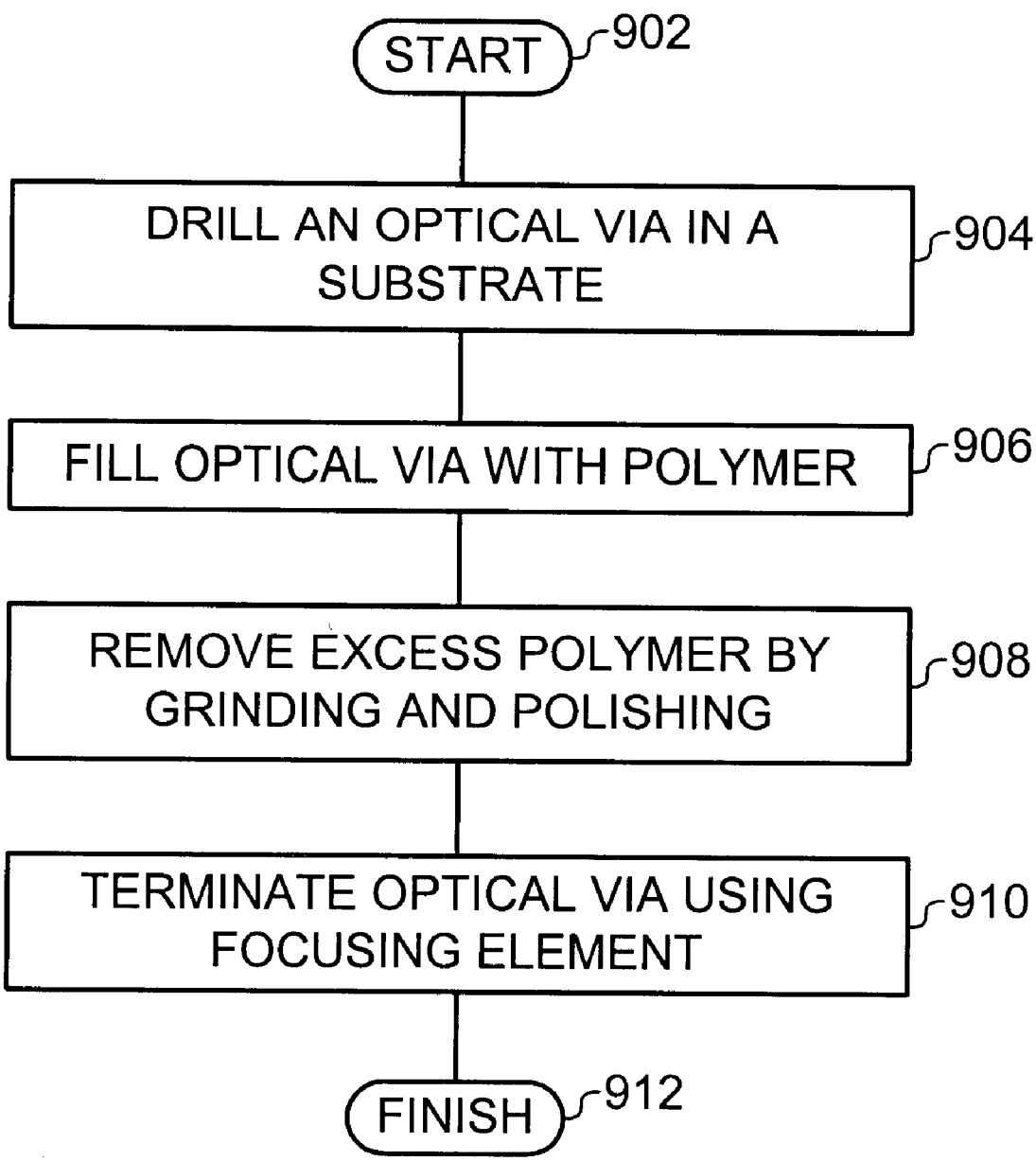
FIG. 9 is a flow chart depicting an example method to assemble the package depicted in FIGS. 4 and 5.

FIG. 9 illustrates a flow chart depicting a process 900 to assemble the package 400 and 500. A machine-readable medium with machine-readable instructions stored thereon may be used to cause a machine to perform the process 900. The process 900 begins with block 902, where control immediately passes to block 904.

In block 904, an optical via is created in a (BGA package) substrate. In one embodiment, the optical via is drilled alongside electrical vias using laser drilling.

In block 906, the optical via 420 is filled with a suitable underfill polymer.

In block 908, excess underfill polymer is removed from the substrate. In one embodiment, excess underfill polymer is removed by grinding and polishing, which yields a flat surface. The grinding is continued until the metal features (e.g., electrical features such as landing pads and traces that are present on the substrate top and bottom surfaces) are fully exposed. Partial thickness of the metal traces may be removed as well. When this is the case, the metal traces may be plated to compensate for the removed thickness.

In block 910, the optical via 520 is terminated using a focusing element, such as a polymer lens. The focusing element may be laminated. The process 900 ends, as indicated by block 912.

Figure 10:
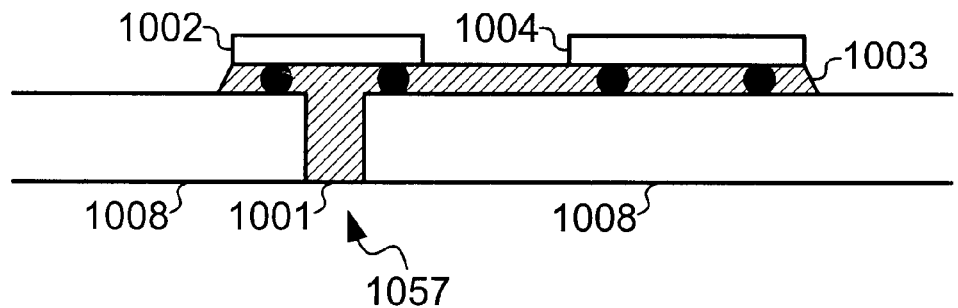
FIG. 10 is a cross-sectional view of an alternative package suitable for implementing embodiments of the present invention, in which a top emitting or sensing optically active device and a driver or transimpedance amplifier chip 1004 are flip-bonded to a substrate.

FIG. 10 is a cross-sectional view of an alternative package 1000 suitable for implementing embodiments of the present invention, in which a top emitting or sensing optically active device 1002 and a driver or transimpedance amplifier chip 1004 are flip-bonded to a substrate 1008. The substrate 1008 has an optical via 1057 filled with an underfill polymer material 1001. An underfill polymer material 1003 fills the gap between a device 1002, a driver or transimpedance amplifier chip 1004, and a substrate 1008. The underfill polymer material 1001 is optically transparent and has a refractive index that is higher than the refractive index of the underfill polymer material 1003 surrounding the optical via 1057. The process to make the package 1000 is described with reference to FIG. 15.

Figure 11:
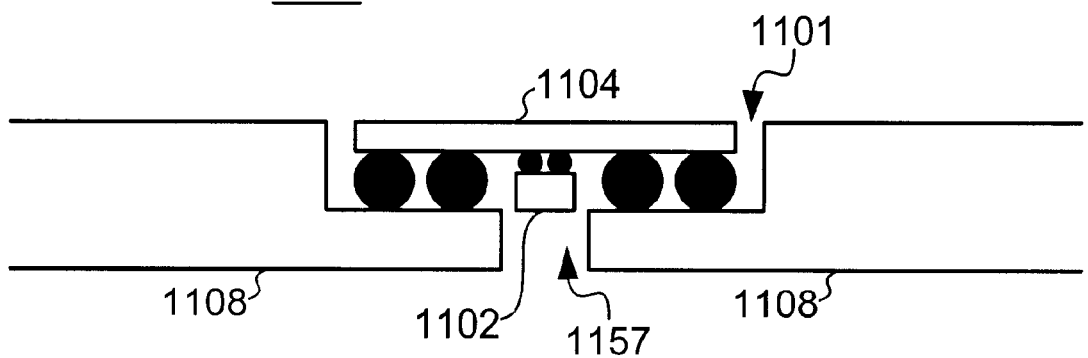
FIG. 11 is a cross-sectional view of an alternative package suitable for implementing embodiments of the present invention, in which a bottom emitting or sensing optically active device is flip-bonded to a driver or transimpedance amplifier chip and the driver or transimpedance amplifier chip is flip-bonded to a substrate.

FIG. 11 is a cross-sectional view of an alternative package 1100 suitable for implementing embodiments of the present invention, in which a bottom emitting or sensing optically active device 1102 is flip-bonded to a driver or transimpedance amplifier chip 1104 and the driver or transimpedance amplifier chip 1104 is flip-bonded to a substrate 1108. The substrate 1108 has a cavity 1101 for a driver or transimpedance amplifier chip 1104 and an optical via 1157 for a device 1102. The optical via 1157 need only be large enough to pass the light. The process to make the package 1100 is described with reference to FIG. 16.

Figure 12:
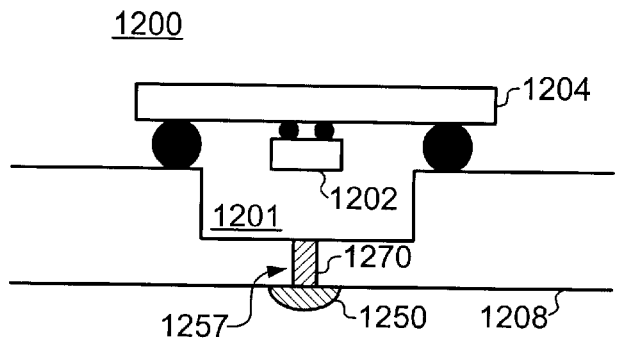
FIG. 12 is a cross-sectional view of a package suitable for implementing embodiments of the present invention, in which a bottom emitting or sensing optically active device is flip-bonded on a driver or transimpedance amplifier chip, the driver or transimpedance amplifier chip is flip-bonded to a substrate.

FIG. 12 is a cross-sectional view of a package 1200 suitable for implementing embodiments of the present invention, in which a bottom emitting or sensing optically active device 1202 is flip-bonded on a driver or transimpedance amplifier chip 1204, the driver or transimpedance amplifier chip 1204 is flip-bonded to a substrate 1208. The substrate 1208 has a cavity 1201 and an optical via 1257. The optical via 1257 is filled with substrate laminate polymer material 1270 and terminated with a focusing element 1250, such as a lens. The process to make the package 1200 is described with reference to FIG. 17.

Figure 13:
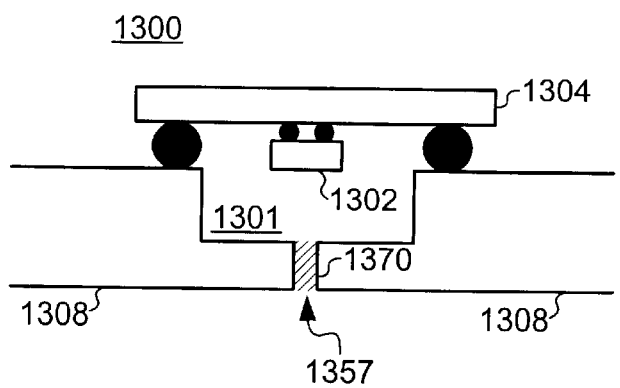
FIG. 13 is a cross-sectional view of a package suitable for implementing embodiments of the present invention, in which a bottom emitting or sensing optically active device is flip-bonded on a driver or transimpedance amplifier chip.

FIG. 13 is a cross-sectional view of a package 1300 suitable for implementing embodiments of the present invention, in which a bottom emitting or sensing optically active device 1302 is flip-bonded on a driver or transimpedance amplifier chip 1304. The driver or transimpedance amplifier chip 1304 is flip-bonded to a substrate 1308. The substrate 1308 has a cavity 1301 and an optical via 1357, which is filled with substrate laminate polymer material 1301. The process to make the package 1300 is described with reference to FIG. 18.

Figure 14:
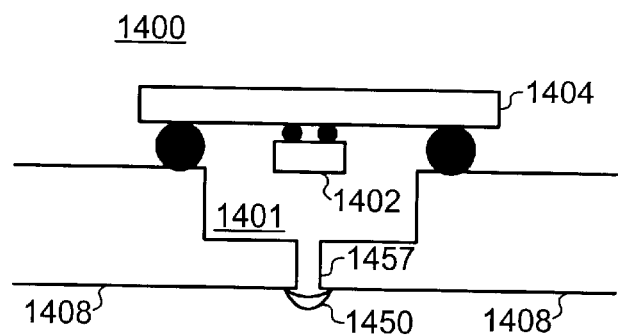
FIG. 14 is a cross-sectional view of a package suitable for implementing embodiments of the present invention, in which a bottom emitting or sensing optically active device is flip-bonded on a driver or transimpedance amplifier chip.

FIG. 14 is a cross-sectional view of a package 1400 suitable for implementing embodiments of the present invention, in which a bottom emitting or sensing optically active device 1402 is flip-bonded on a driver or transimpedance amplifier chip 1404. The driver or transimpedance amplifier chip 1404 is flip-bonded to a substrate 1408. The substrate 1408 has a cavity 1401 and an optical via 1457, which is terminated with a focusing element 1450, such as a lens. The process to make the package 1400 is described with reference to FIG. 19.

Figure 15:
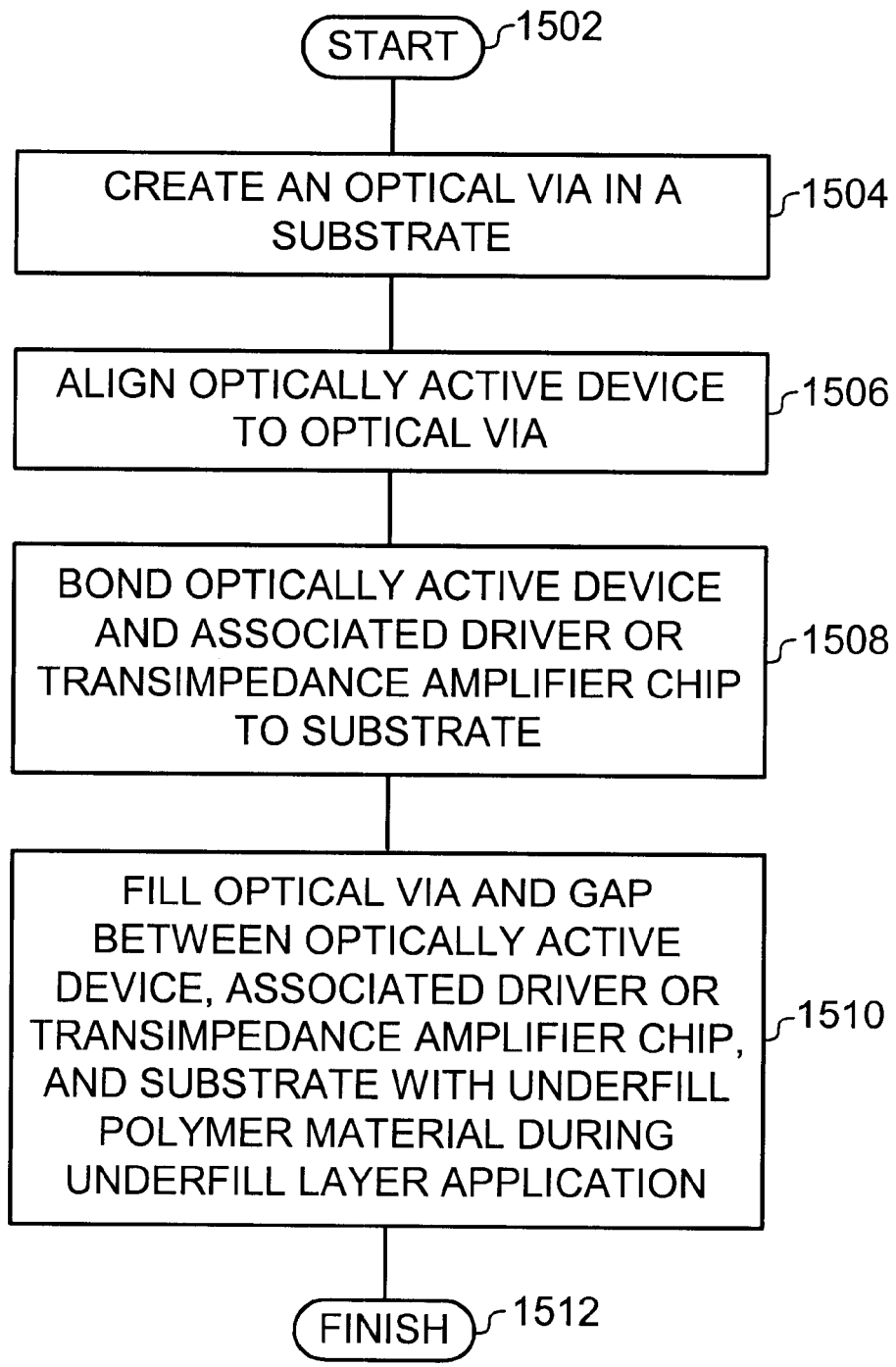
FIG. 15 illustrates a flow chart depicting a process to assemble the package depicted in FIG. 10.

FIG. 15 illustrates a flow chart depicting a process 1500 to assemble the package 1000. A machine-readable medium with machine-readable instructions stored thereon may be used to cause a machine to perform the process 1500. The process 1500 begins with block 1502, where control immediately passes to block 1504.

In block 1504, the optical via 1057 is created in the substrate 1008. In one embodiment, the optical via 1057 is drilled alongside electrical vias using laser drilling. In block 1506, the device 1002 is aligned to the optical via 1057. In block 1508, the device 1002 and the driver or transimpedance amplifier chip 1004 are bonded to the substrate. In block 1510, the optical via and the gap between the device 1002, the driver or transimpedance amplifier chip 1004, and the substrate 1008 are filled with the underfilling polymer material 1001 during application of the underfill layer. In block 1512, the process 1500 ends.

Figure 16:
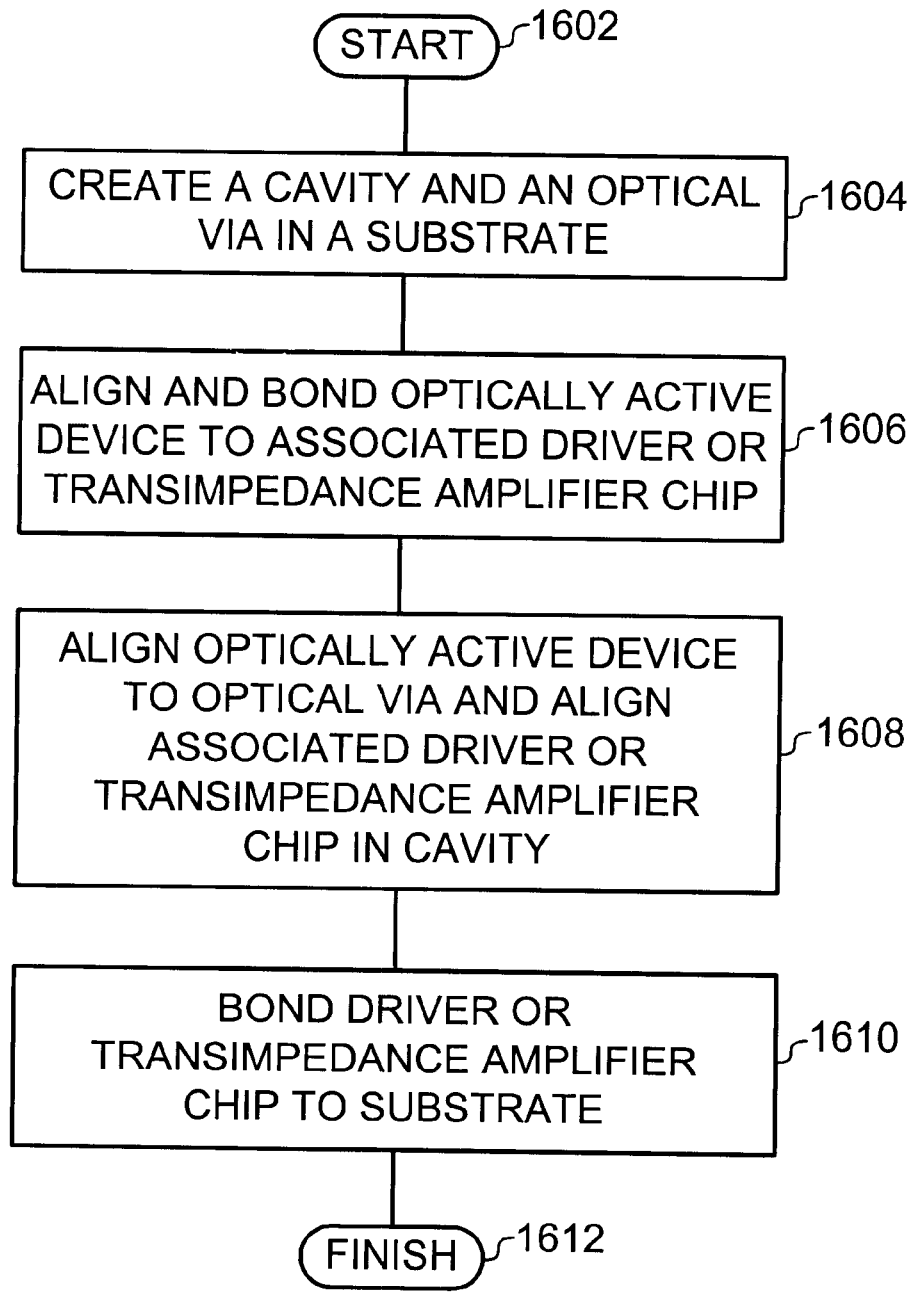
FIG. 16 illustrates a flow chart depicting a process to assemble the package depicted in FIG. 11.

FIG. 16 illustrates a flow chart depicting a process 1600 to assemble the package 1100. A machine-readable medium with machine-readable instructions stored thereon may be used to cause a machine to perform the process 1600. The process 1600 begins with block 1602, where control immediately passes to block 1604.

In block 1604, the cavity 1101 and the optical via 1157 are created in the substrate 1108. In block 1606, the device 1102 is aligned and flip-bonded to the driver or transimpedance amplifier chip 1104. In block 1608, the device 1102 is aligned to the optical via 1057 and the driver or transimpedance amplifier chip 1104 is aligned in the cavity 1101. In block 1610, the device 1102 and the driver or transimpedance amplifier chip 1104 are bonded to the substrate. In block 1612, the process 1600 ends.

Figure 17:
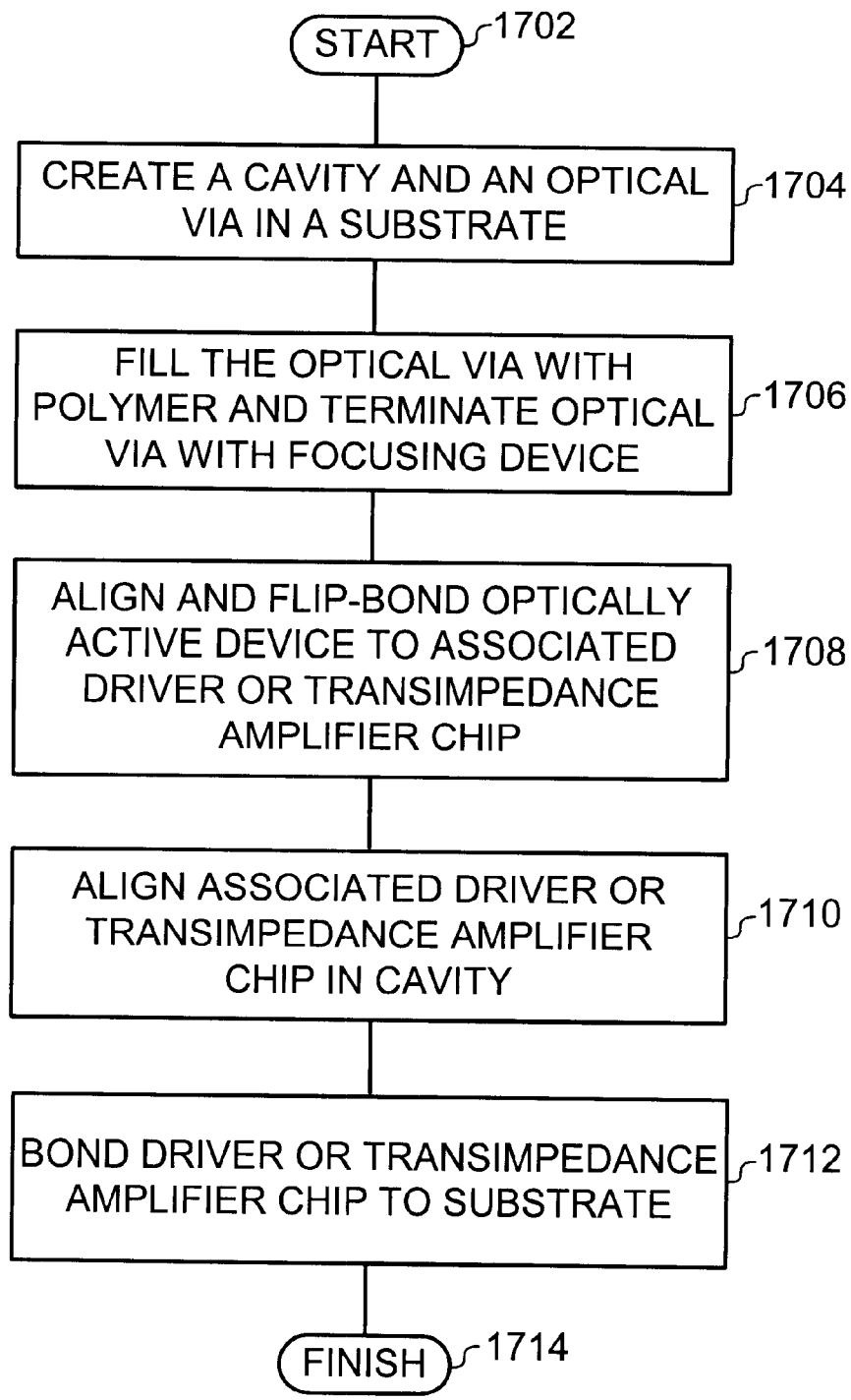
FIG. 17 illustrates a flow chart depicting a process to assemble the package depicted in FIG. 12.

FIG. 17 illustrates a flow chart depicting a process 1700 to assemble the package 1200. A machine-readable medium with machine-readable instructions stored thereon may be used to cause a machine to perform the process 1700. The process 1700 begins with block 1702, where control immediately passes to block 1704.

In block 1704, the cavity 1201 and the optical via 1257 are created in the substrate 1208. In block 1706, the optical via 1257 is filled with the polymer 1270 and terminated with the focusing device 1250. In block 1708, the device 1202 is aligned and flip-bonded to the driver or transimpedance amplifier chip 1204. In block 1710, the driver or transimpedance amplifier chip 1204 is aligned to the cavity 1201 ensuring that the device is aligned with the optical via 1257. In block 1712, the driver or transimpedance amplifier chip 1204 is bonded to the substrate 1208. In block 1714, the process 1700 ends.

Figure 18:
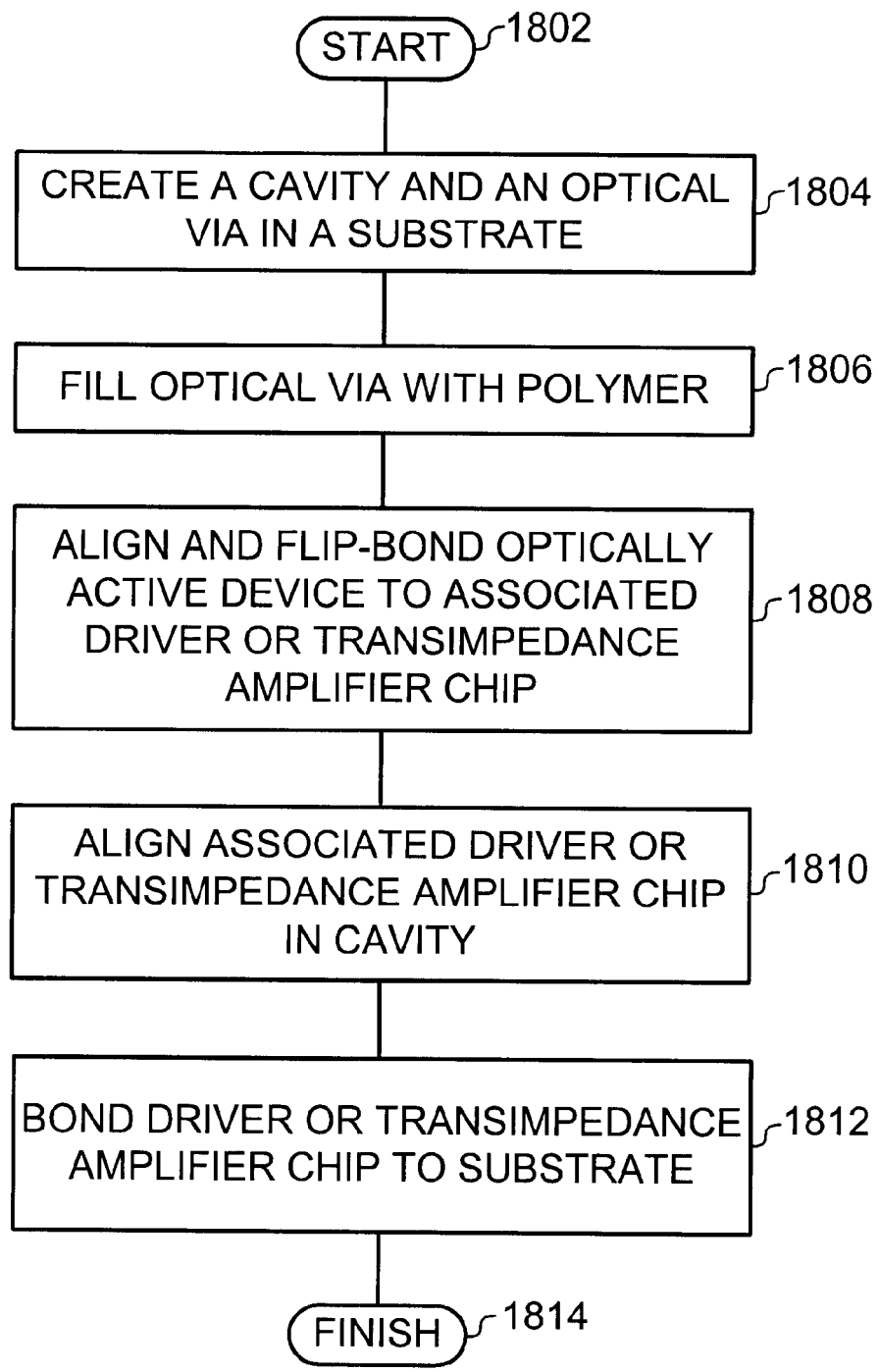
FIG. 18 illustrates a flow chart depicting a process to assemble the package depicted in FIG. 13.

FIG. 18 illustrates a flow chart depicting a process 1800 to assemble the packages 1300. A machine-readable medium with machine-readable instructions stored thereon may be used to cause a machine to perform the process 1800. The process 1800 begins with block 1802, where control immediately passes to block 1804.

In block 1804, the cavity 1301 and the optical via 1357 are created in the substrate 1308. In block 1806, the optical via 1357 is filled with the polymer 1370. In block 1808, the device 1302 is aligned and flip-bonded to the driver or transimpedance amplifier chip 1304. In block 1810, the driver or transimpedance amplifier chip 1304 is aligned to the cavity 1301 ensuring that the device is aligned with the optical via 1357. In block 1812, the driver or transimpedance amplifier chip 1304 is bonded to the substrate 1308. In block 1814, the process 1800 ends.

Figure 19:
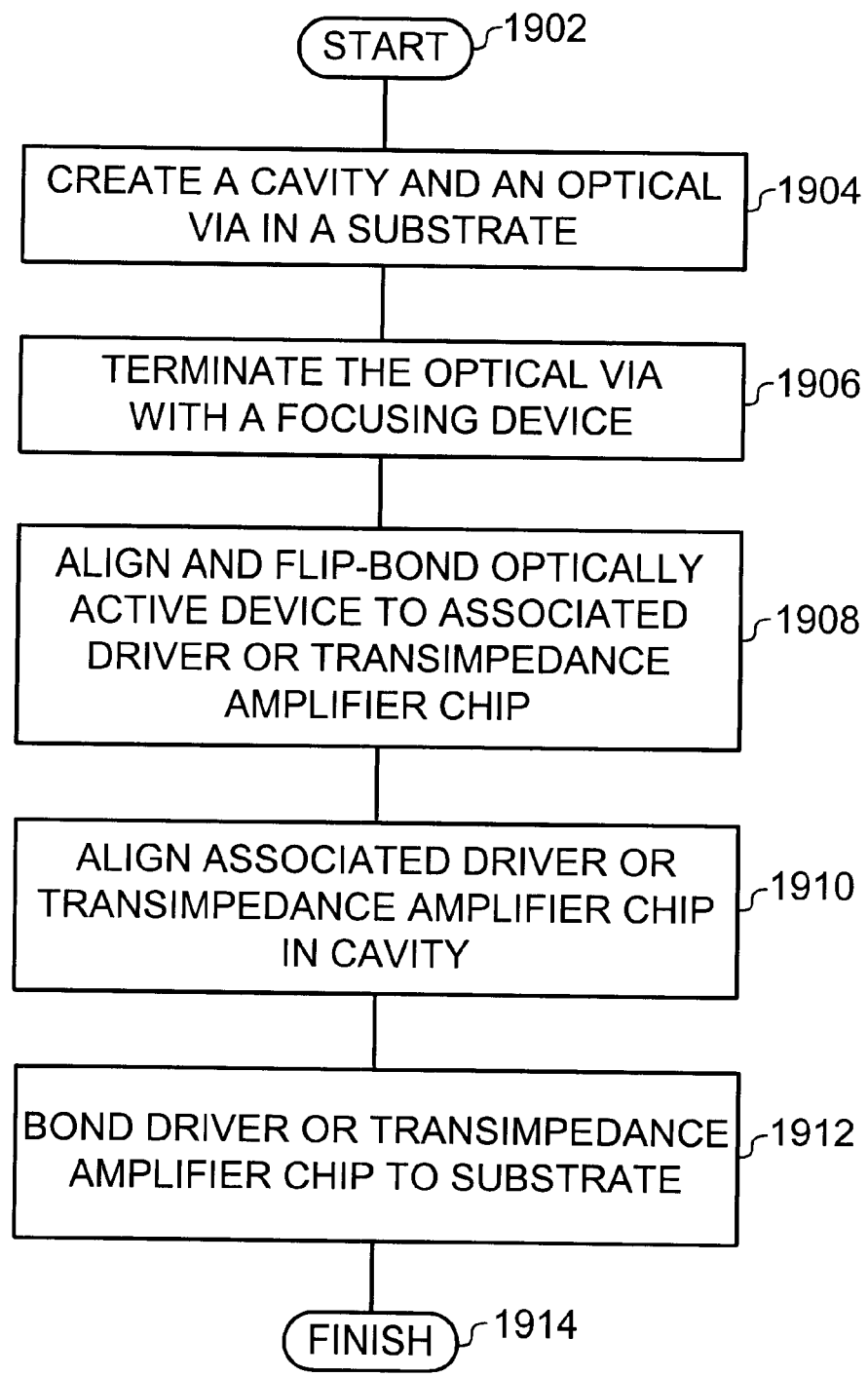
FIG. 19 illustrates a flow chart depicting a process to assemble the package depicted in FIG. 14.

FIG. 19 illustrates a flow chart depicting a process 1900 to assemble the package 1400. A machine-readable medium with machine-readable instructions stored thereon may be used to cause a machine to perform the process 1900. The process 1900 begins with block 1902, where control immediately passes to block 1904.

In block 1904, the cavity 1401 and the optical via 1457 are created in the substrate 1408. In block 1906, the optical via 1457 is terminated with the focusing device 1450. In block 1908, the device 1402 is aligned and flip-bonded to the driver or transimpedance amplifier chip 1404. In block 1910, the driver or transimpedance amplifier chip 1404 is aligned to the cavity 1401 ensuring that the device is aligned with the optical via 1457. In block 1912, the driver or transimpedance amplifier chip 1404 is bonded to the substrate 1408. n block 1914, the process 1900 ends.

Figure 20:
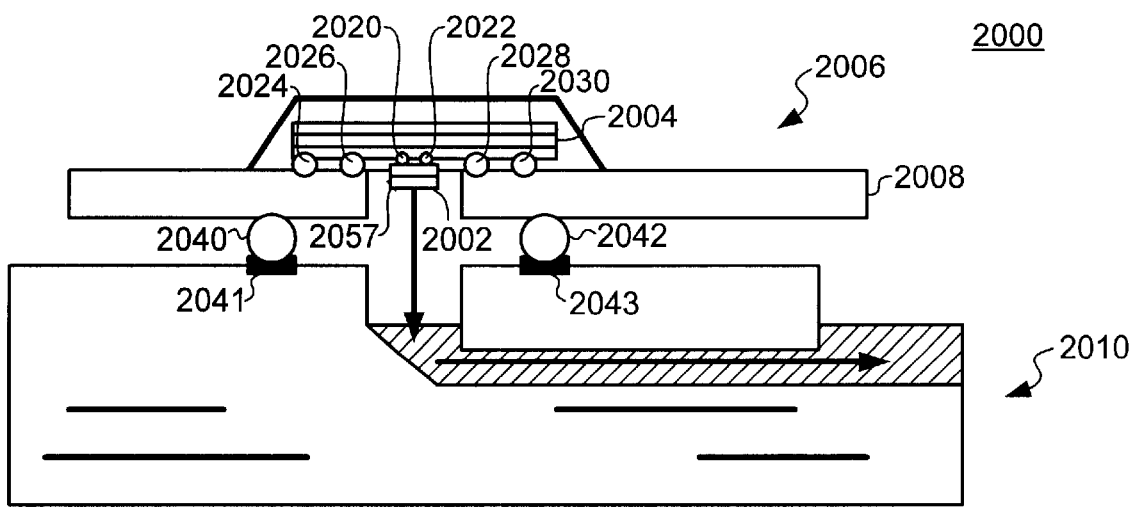
FIG. 20 is a cross-sectional view of an alternative package suitable for implementing embodiments of the present invention, in which a bottom emitting or sensing optically active device is flip-bonded on a driver or transimpedance amplifier chip.

FIG. 20 is a cross-sectional view of a package 2000 suitable for implementing embodiments of the present invention, in which a bottom emitting or sensing optically active device 2002 is flip-bonded on a driver or transimpedance amplifier chip 2004. The driver or transimpedance amplifier chip 1404 is flip-bonded to a substrate 2008 of a package 2006.

The substrate 2008 has an optical via 2057. Solder balls 2040 and 2042 rest over pad areas 2041 and 2043, respectively. The package 2006 is aligned to the PCB 2010 using the solder balls 2040 and 2042 and the pad areas 2041 and 2043 such that the light sensing or detecting area of the device 2002 is aligned with the optical via 2157. The solder ball-to-pad contact determines the vertical separation of the package 2006 and the PCB 2010. This design feature ensures that solder balls and pad areas will remain in an intimate (i.e. high coupling efficiency) optical contact after assembly of the package 2000. The optical via 2057 may be partially or fully filled with an underfill material that is transparent to light.

Figure 21:
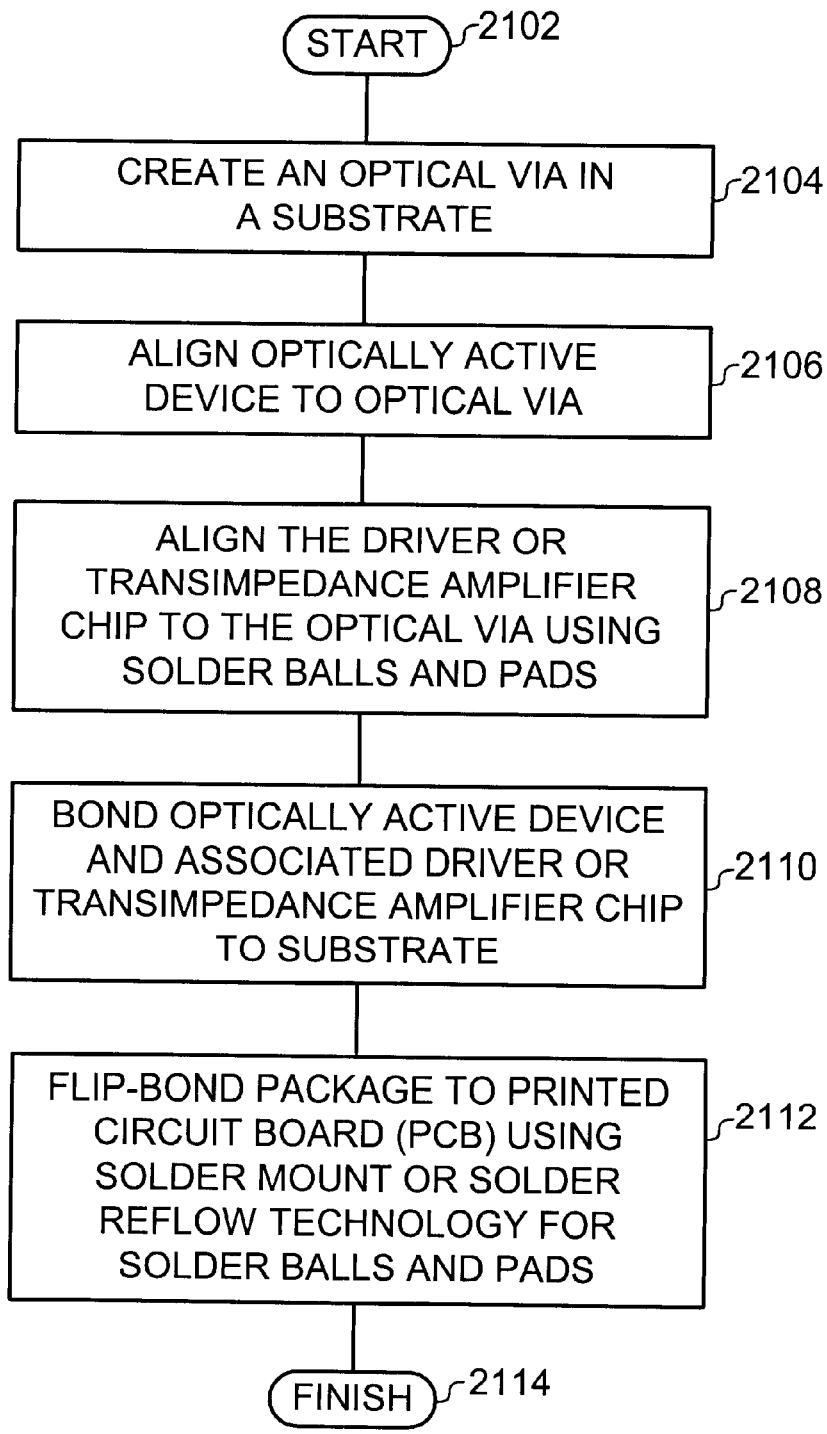
FIG. 21 illustrates a flow chart depicting a process to assemble the package depicted in FIG. 20.

FIG. 21 illustrates a flow chart depicting a process 2100 to assemble the package 2000. A machine-readable medium with machine-readable instructions stored thereon may be used to cause a machine to perform the process 2100. The process 2100 begins with block 2102, where control immediately passes to block 2104.

In block 2104, the optical via 2057 is created in the substrate 2008. In one embodiment, the optical via 2057 is drilled alongside electrical vias using laser drilling. In block 2106, the device 2002 is aligned to the optical via 2057. In block 2108, the driver or transimpedance amplifier chip 2004 is aligned to the optical via 2057 using the solder balls 2040 and 2042 and the pads 2041 and 2043, respectively. In block 2110, the device 2002 and the driver or transimpedance amplifier chip 2004 are bonded to the substrate. In block 2112, the package 2006 is flip-bonded to the PCB 2010 using solder mount or solder reflow technology for the solder balls 2040 and 2042 and the pads 2041 and 2043. In block 2114, the process 2100 ends.

Although the embodiments of the present invention are described with respect to various embodiments, the present invention is not so limited. For example, any or all of the packages described herein may be used in optical bus applications to eliminate critical signal integrity and latency issues. In this embodiment, the packages may support more than the few processors currently supported by shared electrical buses.

The packages described herein may be used for optical ports, as well. This is particularly advantageous in high-speed networking environments, which are migrating towards fiber optics. The optical ports connect to the optical fiber used in fiber optic systems.

Embodiments of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    a substrate having a plurality of connection means disposed on an underside thereof and an aperture defined therethrough;
    an integrated circuit having an underside flip-bonded to a topside of the substrate; and
    an optically active device flip-bonded to the underside of the integrated circuit to generate or receive an optical signal passing through the aperture in the substrate.

2. The apparatus of claim 1 wherein the apparatus comprises a Ball Grid Array package, and the plurality of connection means comprise a plurality of solder balls.

3. The apparatus of claim 1 wherein the optical device is a vertical cavity surface emitting laser (VCSEL), light emitting diode (LED), photodetector, or optical modulator.

4. The apparatus of claim 1 wherein the optically active device is flip-bonded to the integrated circuit using solder bumps.

5. The apparatus of claim 1 wherein the optically active device is flip-bonded to the integrated circuit using solder reflow technology.

6. The apparatus of claim 1 wherein the integrated circuit comprises one of an optical device driver, a transimpedance amplifier, a microprocessor, a microprocessor chip set, a networking integrated circuit, or a memory.

7. The apparatus of claim 1, further comprising a printed circuit board (PCB) operatively coupled to the underside of the substrate via the plurality of connection means.

8. The apparatus of claim 7 wherein the PCB includes a waveguide to steer light to or from the optically active device.

9. The apparatus of claim 7 wherein one of the PCB and the substrate include alignment grooves, and the other of the PCB and substrate include alignment balls, said alignment grooves and alignment balls used to align the substrate with the PCB.

10. The apparatus of claim 8 wherein the waveguide is faceted forty-five degrees to steer light to or from the optically active device.

11. The apparatus of claim 9, wherein the PCB is flip-bonded to the substrate using solder reflow technology, wherein the PCB is initially aligned with the substrate using the alignment grooves and alignment balls, and wherein during a solder reflow operation the surface tension on the solder pulls the substrate into alignment with the PCB.

12. The apparatus of claim 2, wherein the Ball Grid Array package is flip-mounted to a printed circuit board (PCB) including an optical waveguide and the optically active device is optically coupled to the optical waveguide.

13. An apparatus, comprising:
    a substrate having a plurality of connection means disposed on an underside thereof and an optical via defined therethrough;
    an optically active device flip-bonded to a topside of the substrate and positioned to receive or emit an optical signal via the optical via; and
    an integrated circuit flip-bonded to the topside of the substrate next to the optically active device.

14. The apparatus of claim 13 wherein the optical via is filled with an underfill polymer having an index of refraction less than the index of refraction of the substrate surrounding the optical via.

15. The apparatus of claim 13 wherein the optical via is filled with a substrate laminate polymer having an index of refraction less than the index of refraction of the substrate surrounding the optical via.

16. The apparatus of claim 13 wherein the optical via is terminated by a lens.

17. The apparatus of claim 13, further comprising a printed circuit board (PCB) operatively coupled to the underside of the substrate via the plurality of connection means.

18. The apparatus of claim 17 wherein the PCB includes a waveguide to steer light to or from the optically active device.

19. The apparatus of claim 17 wherein one of the PCB and the substrate include alignment grooves, and the other of the PCB and substrate include alignment balls, said alignment grooves and alignment balls used to align the substrate with the PCB.

20. The apparatus of claim 18 wherein the waveguide is faceted forty-five degrees to steer light to or from the optically active device.

21. The apparatus of claim 19, wherein the PCB is flip-bonded to the substrate using solder reflow technology, wherein the PCB is initially aligned with the substrate using the alignment grooves and alignment balls, and wherein during a solder reflow operation the surface tension on the solder pulls the substrate into alignment with the PCB.

22. The apparatus of claim 13 wherein the apparatus comprises a Ball Grid Array package, and the plurality of connection means comprise a plurality of solder balls.

23. An apparatus, comprising:
a substrate having a plurality of connection means disposed on an underside thereof;
an integrated circuit wire-bonded to the underside of the substrate; and
an optically active device flip-bonded to the integrated circuit.

24. The apparatus of claim 23, further comprising a printed circuit board (PCB) operatively coupled to the substrate via the plurality of connection means.

25. The apparatus of claim 24 wherein the PCB includes a waveguide to steer light to or from the optically active device.

26. The apparatus of claim 24 wherein one of the PCB and the substrate include alignment grooves, and the other of the PCB and substrate include alignment balls, said alignment grooves and alignment balls used to align the substrate with the PCB.

27. The apparatus of claim 25 wherein the waveguide is faceted forty-five degrees to steer light to or from the optically active device.

28. The apparatus of claim 26, wherein the PCB is flip-bonded to the substrate using solder reflow technology, wherein the PCB is initially aligned with the substrate using the alignment grooves and alignment balls, and wherein during a solder reflow operation surface tension on the solder pulls the substrate into alignment with the PCB.

29. A method, comprising:
flip-bonding an optically active device to an integrated circuit;
aligning the optically active device to a clearance in a substrate; and
flip-bonding the integrated circuit to the substrate.

30. The method of claim 29, further comprising flip-bonding the substrate to a printed circuit board using solder mount technology or solder reflow technology.

31. The method of claim 30, further comprising aligning the substrate to a printed circuit board using alignment balls and alignment grooves.

32. The method of claim 29, wherein the substrate includes a plurality of connection means disposed on an underside thereof, the method further comprising encapsulating the integrated circuit to form a packaged component.

33. A method, comprising:
aligning an optically active device to a clearance in a substrate;
flip-bonding the optically active device to the substrate; and
flip-bonding an integrated circuit to the substrate next to the optically active device.

34. The method of claim 33, further comprising aligning the optically active device to a clearance in the substrate using solder bumps.

35. The method of claim 33, further comprising flip-bonding the substrate to a printed circuit board (PCB) using solder mount technology or solder reflow technology.

36. The method of claim 35, further comprising aligning the substrate to the PCB using alignment balls and alignment grooves.

37. The method of claim 33, wherein the substrate includes a plurality of connection means disposed on an underside thereof, the method further comprising encapsulating the integrated circuit and optical active device to form a packaged component.

38. A method, comprising:
flip-bonding an optically active device to an integrated circuit; and
wire-bonding the integrated circuit to an underside of a substrate having a plurality of connection means disposed on the underside thereof; and
encapsulating the optically active device and the integrated circuit to form a packaged component including an optical via disposed on the underside of the packaged component to enable light signals to be emitted from or received by the optically active device.

39. The method of claim 38, further comprising flip-bonding the substrate to a printed circuit board (PCB) using solder mount technology or solder reflow technology.

40. The method of claim 39, further comprising aligning the substrate to the PCB using alignment balls and alignment grooves.

41. A method, comprising:
drilling an optical via in a substrate;
filling the optical via with an underfill polymer;
grinding excess underfill polymer;
aligning an optically active device to the optical via;
flip-bonding the optically active device to the substrate; and
flip-bonding an integrated circuit to the substrate next to the optically active device.

42. The method of claim 41, further comprising terminating the optical via using a focusing element.

43. The method of claim 42, wherein the focusing element is a lens.

* * * * *